(12) United States Patent
Verma et al.

(10) Patent No.: US 7,814,136 B1
(45) Date of Patent: Oct. 12, 2010

(54) PROGRAMMABLE LOGIC SYSTEMS AND METHODS EMPLOYING CONFIGURABLE FLOATING POINT UNITS

(75) Inventors: Hare K. Verma, Cupertino, CA (US); Ravi Sunkavalli, Milpitas, CA (US); Manoj Gunwani, San Jose, CA (US)

(73) Assignee: Agate Logic, Inc., Cupertino, CA (US)

( * ) Notice: Subject to any disclaimer, the term of this patent is extended or adjusted under 35 U.S.C. 154(b) by 1207 days.

(21) Appl. No.: 11/344,694

(22) Filed: Feb. 1, 2006

(51) Int. Cl.
*G06F 7/38* (2006.01)
(52) U.S. Cl. ..................................... 708/230
(58) Field of Classification Search ................... 708/230
See application file for complete search history.

(56) References Cited

U.S. PATENT DOCUMENTS

| | | | |
|---|---|---|---|
| 6,294,928 B1 * | 9/2001 | Lytle et al. ..................... 326/41 |
| 6,978,287 B1 * | 12/2005 | Langhammer ............... 708/230 |
| 7,176,717 B2 | 2/2007 | Sunkavalli et al. |
| 7,358,765 B2 | 4/2008 | Verma et al. |
| 7,368,941 B2 | 5/2008 | Verma et al. |
| 7,414,431 B2 | 8/2008 | Verma et al. |
| 7,414,432 B2 | 8/2008 | Verma et al. |
| 7,417,456 B2 | 8/2008 | Verma et al. |
| 7,439,768 B2 | 10/2008 | Verma et al. |
| 7,546,424 B1 * | 6/2009 | May et al. ..................... 711/149 |
| 7,567,997 B2 * | 7/2009 | Simkins et al. ............. 708/523 |
| 7,605,605 B2 | 10/2009 | Verma et al. |
| 2007/0085564 A1 | 4/2007 | Verma et al. |
| 2007/0085565 A1 | 4/2007 | Verma et al. |

\* cited by examiner

*Primary Examiner*—Tan V Mai
(74) *Attorney, Agent, or Firm*—Radlo & Su LLP

(57) ABSTRACT

A programmable system is disclosed having multiple configurable floating point units ("FPU") that are coupled to multiple programmable logic and routing blocks and multiple memories. Each floating point unit has static configuration blocks and dynamic configuration blocks, where the dynamic configuration blocks can be reconfigured to perform a different floating point unit function. A floating point unit includes a pre-normalization for shifting an exponent calculation as well as shifting and aligning a mantissa, and a post-normalization for normalizing and rounding a received input. The post-normalization receives an input Z and realigns the input, normalizes the input and rounds the input Z.

9 Claims, 13 Drawing Sheets

| | ILRC | OLRC | ILRC | OLRC | ILRC | OLRC | ILRC | OLRC | |
|---|---|---|---|---|---|---|---|---|---|
| 306 LRB | 326 DLC / 326-1 LRC | | 346 DLC / 346-1 LRC | | 366 DLC / 366-1 LRC | | 386 DLC / 386-1 LRC | | 312 LRB |
| | 326-2 LRC | | 346-2 LRC | | 366-2 LRC | | 386-2 LRC | | |
| | 325 DLC / 325-1 LRC | | 345 DLC / 345-1 LRC | | 365 DLC / 365-1 LRC | | 385 DLC / 385-1 LRC | | |
| | 325-2 LRC | | 345-2 LRC | | 365-2 LRC | | 385-2 LRC | | |
| 304 LRB | 324 DLC / 324-1 LRC | | 344 DLC / 344-1 LRC | | 364 DLC / 364-1 LRC | | 384 DLC / 384-1 LRC | | 310 LRB |
| | 324-2 LRC | | 344-2 LRC | | 364-2 LRC | | 384-2 LRC | | |
| | 323 DLC / 323-1 LRC | | 343 DLC / 343-1 LRC | | 363 DLC / 363-1 LRC | | 383 DLC / 383-1 LRC | | |
| | 323-2 LRC | | 343-2 LRC | | 363-2 LRC | | 383-2 LRC | | |
| 302 LRB | 322 DLC / 322-1 LRC | | 342 DLC / 342-1 LRC | | 362 DLC / 362-1 LRC | | 382 DLC / 382-1 LRC | | 308 LRB |
| | 322-2 LRC | | 342-2 LRC | | 362-2 LRC | | 382-2 LRC | | |
| | 321 DLC / 321-1 LRC | | 341 DLC / 341-1 LRC | | 361 DLC / 361-1 LRC | | 381 DLC / 381-1 LRC | | |
| | 321-2 LRC | | 341-2 LRC | | 361-1 LRC | | 381-1 LRC | | |

320 level 0 (first column)   340 level 1 (second column)   360 level 2 (third column)   380 level 3 (fourth column)

levels of DLC

PROGRAMMABLE LOGIC SYSTEMS AND METHODS EMPLOYING CONFIGURABLE FLOATING POINT UNITS

CROSS REFERENCE TO RELATED APPLICATIONS

This application relates to co-pending U.S. patent application Ser. No. 11/036,109, entitled "Programmable Logic and Routing Blocks with Dedicated Lines" by Sunkavalli et al., filed on Jan. 14, 2005, now U.S. Pat. No. 7,176,717, owned by the assignee of this application and incorporated herein by reference; Ser. No. 11/044,386, entitled "Programmable Logic Cells with Local Connections" by Verma et al., now U.S. Pat. Nos. 7,605,605 and 7,728,623, owned by the assignee of this application and incorporated herein by reference; Ser. No. 11/066,336, entitled "Dedicated Logic Cells Employing Configurable Logic and Dedicated Logic Functions" by Verma et al., now U.S. Pat. Nos. 7,358,765, 7,439,768, 7,414,431, owned by the assignee of this application and incorporated herein by reference; Ser. No. 11/065,019, entitled "Dedicated Logic Cells Employing Sequential Logic and Control Logic Functions" by Verma et al., now U.S. Pat. Nos. 7,368,941, 7,417,456, 7,414,432, owned by the assignee of this application and incorporated herein by reference.

BACKGROUND OF THE INVENTION

1. Field of the Invention

The present invention relates generally to programmable integrated circuits and computer systems, and more particularly, to floating point units ("FPU") with programmable fabric.

2. Description of Related Art

Highly mathematical intensive applications are desirable to provide the necessary computing powers in modern systems. Mathematical computations that require complex mathematical equations, very large numbers, or high precision are frequently referred to as floating point calculations. Floating-point numbers are commonly represented as a concatenation of three parts: a sign bit, an exponent field, and a significant field (also known as a mantissa). A well-know industrial standard for floating point numbers and calculations published by the Institute of Electrical and Electronic Engineers (IEEE) is the ANSI/IEEE Standard 754 (1985, reaffirmed 1990), the Standard for Binary Floating Point Arithmetic. As an example of a floating point parameter defined by IEEE, a single precision floating point number has a 23-bit mantissa field, an 8-bit exponent field, and a 1-bit sign field. The most significant bit of the mantissa is not represented such that the most significant bit of the mantissa assumes a value of 1, except for denormal numbers whose most significant bit of the mantissa is zero.

Field programmable gate arrays are often selected by design engineers to provide a flexible approach in programming and re-programming integrated circuits in order to accommodate a system specification, correct errors in the system, or make improvements to the system by reprogramming the FPGA. One conventional field programmable gate array architecture is implemented by using groups of look-up tables and programmable interconnect circuits. While the look-up tables and sequential elements are connected to each other, the connections to the groups of look-up tables typically originate from a switchbox located in each group of the look-up table. A hierarchical interconnect structure connects to elements in a look-up table through a switchbox, thereby serving as the primary source of connecting look-up tables from one logic block to another logic block. The inputs to the look-up tables are therefore generated primarily from the switchbox. The look-up table outputs are directly fed to other look-up tables as well as the elements within the look-up tables, but the connections to other look-up tables' inputs are made through the switchbox.

In another conventional structure, a majority of the inputs required for performing all functionality of configurable logic blocks are typically restricted to inputs associated with a particular configurable logic block, other than through the use of the switch box. The same is true for outputs of a particular configurable logic block which are restricted to within the configurable logic block other than through the use of the switch box. A key building block in a programmable logic circuit is the design of a configurable logic block.

With advances in industrial applications, it is desirable to design a program logic chip that provides a configurable floating point unit with programmable logic and routing fabric.

SUMMARY OF THE INVENTION

The present invention describes a programmable system having multiple configurable floating point units that are coupled to multiple programmable logic and routing blocks and multiple memories. Each floating point unit has static configuration blocks and dynamic configuration blocks, where the dynamic configuration blocks can be reconfigured to perform a different FPU function. A floating point unit comprises a pre-normalization for shifting an exponent calculation as well as shifting and aligning a mantissa, and a post-normalization for normalizing and rounding a received input. The post-normalization receives an input Z and realigns the input, normalizes the input, and rounding the input Z.

The programmable system has a set of floating point units in which a connectivity can be made between one floating point unit and a dedicated and logic cell in a logic and routing block. The programmable system can also provide a connectivity between a memory and a floating point unit. In a first application of the programmable system, the programmable chip is configured and programmed for operation as high performance computing. In a second application of the programmable chip, the programmable chip is configured and programmed to operate as a real-time digital signal processing controller. In a third application of the programmable chip, the programmable chip is configured and programmed to operate as an application accelerator.

The structures and methods regarding the present invention are disclosed in the detailed description below. This summary does not purport to define the invention. The invention is defined by the claims. These and other embodiments, features, aspects, and advantages of the invention will become better understood with regard to the following description, appended claims and accompanying drawings.

BRIEF DESCRIPTION OF THE DRAWINGS

FIG. 3 is a block diagram illustrating a programmable logic chip constructed with multiple levels of dedicated logic cells in accordance with the present invention.

DETAILED DESCRIPTION OF EMBODIMENTS OF THE INVENTION

Figure 1:
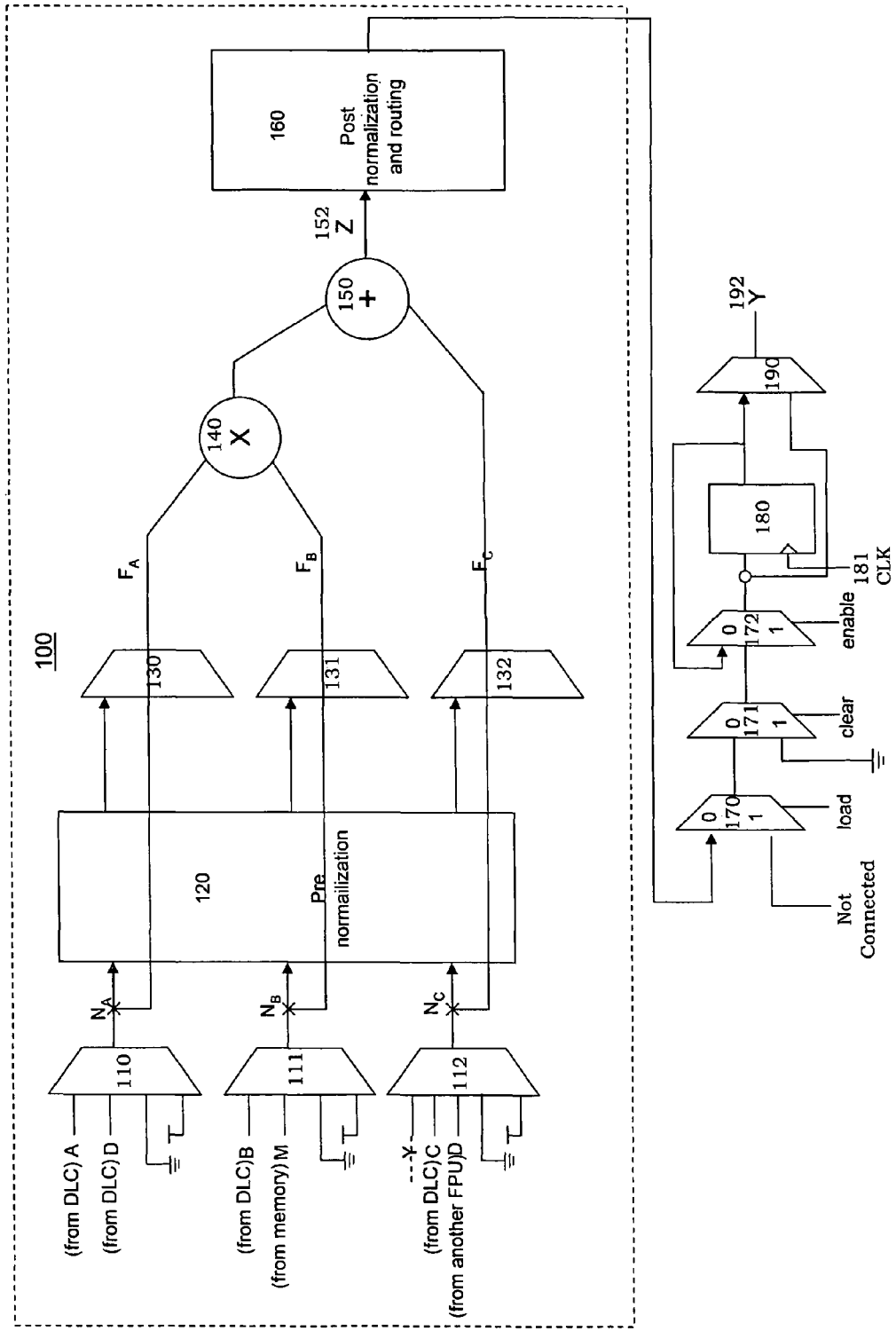
FIG. 1 is a block diagram illustrating a configurable floating point unit in accordance with the present invention.

Referring now to FIG. 1, there is shown a block diagram illustrating a configurable floating point unit 100. A pre-normalization 120 is coupled to a first multiplexer 110, a second multiplexer 111, and a third multiplexer 112. The first multiplexer 110 receives a first input of an operand A from a dedicated logic cell (DLC), a second input of an operand D from DLC, a third input connected to ground and a fourth input connected to a Vdd voltage. The operand D represents an operand from a lower floating point unit for a floating point unit chaining. The first multiplexer generates an output $N_A$ that comprises a sign bit, an exponent field and a mantissa field ($S_A$, $E_A$, $M_A$). The second multiplexer 111 receives a first input of an operand B from DLC, a second input of an operand M, a third input connected to ground and a fourth input connected to a Vdd voltage. The operand M represents an input from a memory. The second multiplexer 111 generates an output $N_B$ that comprises a sign bit, an exponent field and a mantissa field ($S_B$, $E_B$, $M_B$). The third multiplexer 112 receives a first input of operand Y, a second input of an operand C from DLC, a third input of an operand D from another FPU, a fourth input connected to ground, and a fifth input connected to a Vdd voltage. The operand Y represents a floating point unit operand output. The third multiplexer generates an output $N_C$ that comprises a sign bit, an exponent field and a mantissa field ($S_C$, $E_C$, $M_C$).

The pre-normalization block 120 shifts an exponent calculation as well as shifts and aligns a mantissa of the input received of $N_A$ from the first multiplexer 110, the input received of $N_B$ from the second multiplexer 111, and the input received of $N_C$ from the third multiplexer 112, The pre-normalization 120 is further coupled at outputs to a fourth multiplexer 130, a fifth multiplexer 131, and sixth multiplexer 132. The fourth multiplexer 130 selects to either perform an integer multiply from a first input coupled to the pre-normalization 120 or a FPU operation from a second input directly from $N_A$, and generates an output $F_A$. The fifth multiplexer 131 selects to either perform an integer multiply from a first input coupled to the pre-normalization 120 or a FPU operation from a second input directly from $N_B$, and generates an output $F_B$. The sixth multiplexer 132 selects to either perform an integer multiply from a first input coupled to the pre-normalization 120 or a FPU operation from a second input directly from $N_C$, and generates an output $F_C$. A multiplier 140 multiplies the $F_A$ value from the fourth multiplexer 130 with the $F_B$ value from the fifth multiplexer 131. An adder 150 sums the result of $F_A*F_B$ from the multiplexer 140 with the $F_C$ value from the sixth multiplexer 132 to produce a floating point output Z 152, where the floating point operation is represented as $Z=F_A*F_B+F_C$.

A post normalization and routing 160 receives the input Z 152 with FPU operations of a multiply operation and an add operation. Other types of FPU operations as defined in IEEE-754 are also applicable to the present invention including but not limited to a subtraction operation, a division operation, a square root operation, and a remainder operation. The post-normalization and routing 160 realigns the input Z 152, normalizes the input Z 152, and rounding the input Z 152 to the nearest even value according to the IEEE standard. The rounding operation depends on the bits information and the type of floating point unit, which can round a number to the nearest even, round a number up or truncate a number, round a number to a positive infinity, or round a number to a negative infinity. A multiplexer 170 has a load select signal with a first input coupled to the post normalization and routing 150 and a second input that is not connected. A multiplexer 171 has a clear select signal with a first input coupled to the multiplexer 170 and a second input connected to ground. A multiplexer 172 has an enable select signal with a first input and a second input coupled to the multiplexer 171. A configuration register 180 has a first input connected to the multiplexer 172, a clock input 181, and an output. The configurable register 180 selects a combination, all or none of the load, clear, and/or enable signals from multiplexers 170, 171 and 172. The output of the register 180 is connected to the first input of the multiplexer 172. A multiplexer 190 has a first input coupled to the register 180 and a second input coupled directly from an output of the multipelxer 172 and generates an output Y 191.

Figure 2:
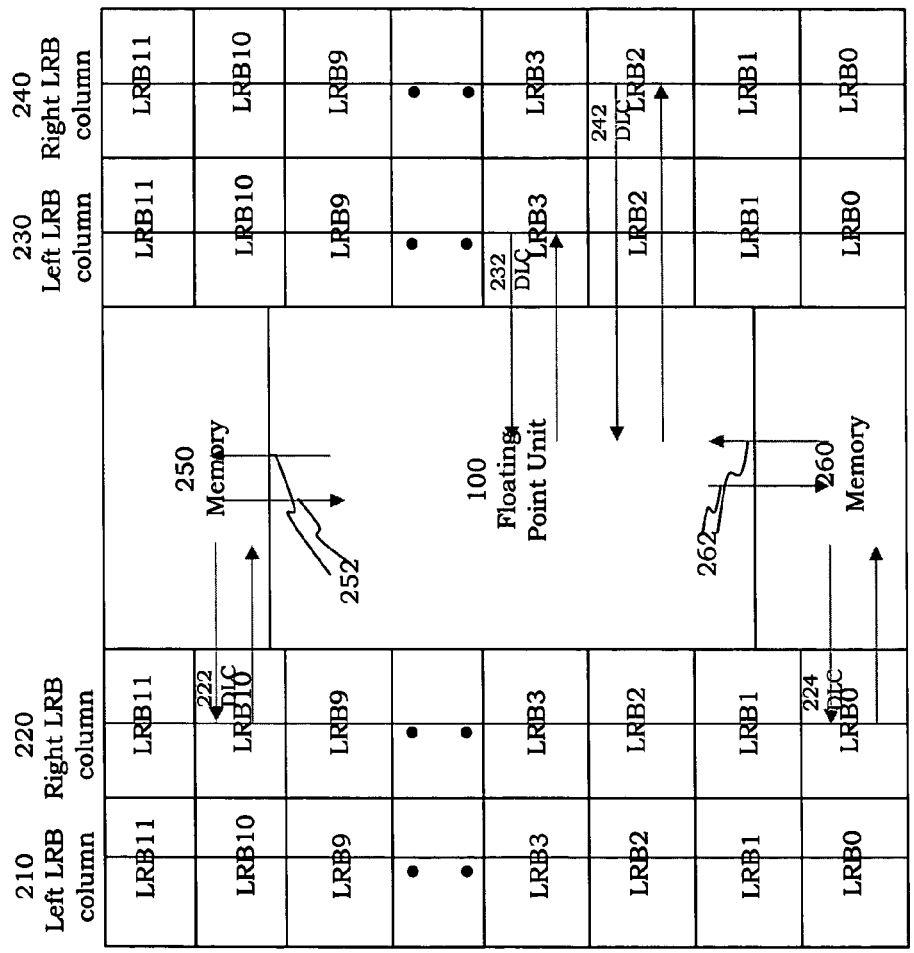
FIG. 2 is an architectural diagram illustrating a programmable system that comprises a configurable floating point unit operating with programmable logic and routing blocks and memories in accordance with the present invention.

As shown in FIG. 2, there is an architectural diagram illustrating a programmable system 200 that comprises a configurable floating point unit 100 operating with programmable logic and routing blocks and memories. The floating point unit 100 is coupled to two columns of logic and routing blocks 210 and 220 on the left side, and is coupled to two columns of logic and routing blocks 230 and 240 on the right side. The floating point unit 100 is further coupled to a memory 250 on top and a memory 260 on bottom. In this embodiment, each column of the logic and routing blocks 210, 220, 230 and 240 has twelve logic and routing blocks, which is further described below with respect to FIG. 3. Each logic and routing block comprises four dedicated logic and routing blocks, as described below with respect to FIG. 4.

A DLC in a logic and routing block provide a connection between a floating point unit and a logic and routing block, or provide a connection between a memory and a logic and routing block. For Example, a DLC 232 in the column of the logic and routing block 230 is coupled to the floating point unit 100 for communication between the dedicated logic cell 232 and the floating point unit 100. Similarly, a DLC 242 in the column of the logic and routing block 240 is coupled to the floating point unit 100 for communication between the dedicated logic cell 242 and the floating point unit 100. A DLC 222 in the column of logic and routing block 220 is connected to the memory 250 for communication between the dedicated logic cell 222 and the memory 250. A DLC 224 in the column of the logic and routing block 220 is connected to the memory 260 for communication between the dedicated logic cell 224 and the memory 260. Each memory in the memories 250 and 260 can have two ports, port A and port B, for use with two different types of addresses. In the programmable system 200, the memory 250 has one or more direct connections 252 to the floating point unit 250. The memory 260 also has one or more direct connections 262 to the floating point unit 260. Although the above connections are shown individually to flow unidirectionally, these connections can also flow bidirectionally.

In the embodiment shown above with respect to FIG. 2, two columns of the logic and routing blocks, either to the right side of the floating point unit 100 or the left side of the floating point unit 100, may be sufficient to provide the number of connectivity for FPU pins. One of ordinary skill in the art should recognize that additional logical and routing blocks can be provided to add additional connectivity to the pins of the floating point unit 100. Addresses and data busses are preferably arranged so that local connectivity can be made for fraction and exponent bits separately.

In FIG. 3, there is shown a logic diagram illustrating a programmable logic chip 300 constructed with multiple levels (or columns) of DLCs 320, 340, 360, and 380. One column of dedicated logic cells comprises a plurality of dedicated logic cells and connection lines to implement a logic function, such as an adder, a subtractor, an add-subtractor with add-sub control, an accumulator, registers, and multiplexers. The programmable logic chip 300 comprises a first logic and routing block 302, a second logic and routing block 304, a third logic and routing block 306, a fourth logic and routing block 308, a fifth logic and routing block 310, and a sixth logic and routing block 312. Each of the logic and routing blocks comprises four dedicated logic cells arranged in a square format. The first logic and routing block 302 comprises a first dedicated logic cell 321, a second dedicated logic cell 322, a third dedicated logic cell 341, and a fourth dedicated logic cell 342. Each dedicated logic cell comprises two logic and routing cells. The first dedicated logic cell 321 has a first logic and routing cell 321-1 and a second logic and routing cell 321-2, the second dedicated logic cell 322 has a first logic and routing cell 322-1 and a second logic and routing cell 322-2, the third dedicated logic cell 341 has a first logic and routing cell 341-1 and a second logic and routing cell 341-2, and the fourth dedicated logic cell 342 has a first logic and routing cell 342-1 and a second logic and routing cell 342-2.

The second logic and routing block 304 comprises a first dedicated logic cell 323, a second dedicated logic cell 324, a third dedicated logic cell 343, and a fourth dedicated logic cell 344. The first dedicated logic cell 323 has a first logic and routing cell 323-1 and a second logic and routing cell 323-2, the second dedicated logic cell 324 has a first logic and routing cell 324-1 and a second logic and routing cell 324-2, the third dedicated logic cell 343 has a first logic and routing cell 343-1 and a second logic and routing cell 343-2, and the fourth dedicated logic cell 344 has a first logic and routing cell 344-1 and a second logic and routing cell 344-2.

The third logic and routing block 306 comprises a first dedicated logic cell 325, a second dedicated logic cell 326, a third dedicated logic cell 345, and a fourth dedicated logic cell 346. The first dedicated logic cell 325 has a first logic and routing cell 325-1 and a second logic and routing cell 325-2, the second dedicated logic cell 326 has a first logic and routing cell 326-1 and a second logic and routing cell 326-2, the third dedicated logic cell 345 has a first logic and routing cell 345-1 and a second logic and routing cell 345-2, and the fourth dedicated logic cell 346 has a first logic and routing cell 346-1 and a second logic and routing cell 346-2.

The fourth logic and routing block 308 comprises a first dedicated logic cell 361, a second dedicated logic cell 362, a third dedicated logic cell 381, and a fourth dedicated logic cell 382. The first dedicated logic cell 361 has a first logic and routing cell 361-1 and a second logic and routing cell 361-2, the second dedicated logic cell 362 has a first logic and routing cell 362-1 and a second logic and routing cell 362-2, the third dedicated logic cell 381 has a first logic and routing cell 381-1 and a second logic and routing cell 381-2, and the fourth dedicated logic cell 382 has a first logic and routing cell 382-1 and a second logic and routing cell 382-2.

The fifth logic and routing block 310 comprises a first dedicated logic cell 361, a second dedicated logic cell 362, a third dedicated logic cell 383, and a fourth dedicated logic cell 384. The first dedicated logic cell 363 has a first logic and routing cell 363-1 and a second logic and routing cell 363-2, the second dedicated logic cell 364 has a first logic and routing cell 364-1 and a second logic and routing cell 364-2, the third dedicated logic cell 383 has a first logic and routing cell 383-1 and a second logic and routing cell 383-2, and the fourth dedicated logic cell 384 has a first logic and routing cell 384-1 and a second logic and routing cell 384-2.

The sixth logic and routing block 312 comprises a first dedicated logic cell 365, a second dedicated logic cell 366, a third dedicated logic cell 385, and a fourth dedicated logic cell 386. The first dedicated logic cell 365 has a first logic and routing cell 365-1 and a second logic and routing cell 365-2, the second dedicated logic cell 366 has a first logic and routing cell 366-1 and a second logic and routing cell 366-2, the third dedicated logic cell 385 has a first logic and routing cell 385-1 and a second logic and routing cell 385-2, and the fourth dedicated logic cell 386 has a first logic and routing cell 386-1 and a second logic and routing cell 386-2.

The first column (or level 0) of logic and routing block 320 comprises the first dedicated logic cell 321, the second dedicated logic cell 322, the third dedicated logic cell 323, the fourth dedicated logic cell 324, the fifth dedicated logic cell 325, and the sixth dedicated logic cell 326. The second column (or level 1) of logic and routing block 340 is positioned adjacent to the right side of the first column of logic and routing block 320. The second column of logic and routing block 340 comprises the first dedicated logic cell 341, the second dedicated logic cell 342, the third dedicated logic cell 343, the fourth dedicated logic cell 344, the fifth dedicated logic cell 345, and the sixth dedicated logic cell 346. The third column (or level 2) of logic and routing block 360 is positioned adjacent to the right side of the second column of logic and routing block 340. The third column of logic and routing block 360 comprises the first dedicated logic cell 361, the second dedicated logic cell 362, the third dedicated logic cell 363, the fourth dedicated logic cell 364, the fifth dedicated logic cell 365, and the sixth dedicated logic cell 366. The fourth column (or level 3) of logic and routing block 380 is positioned adjacent to the right side of the third column of logic and routing block 360. The fourth column of logic and routing block 380 comprises the first dedicated logic cell 381, the second dedicated logic cell 382, a third dedicated logic cell 383, the fourth dedicated logic cell 384, the fifth dedicated logic cell 385, and the sixth dedicated logic cell 386.

Figure 4:
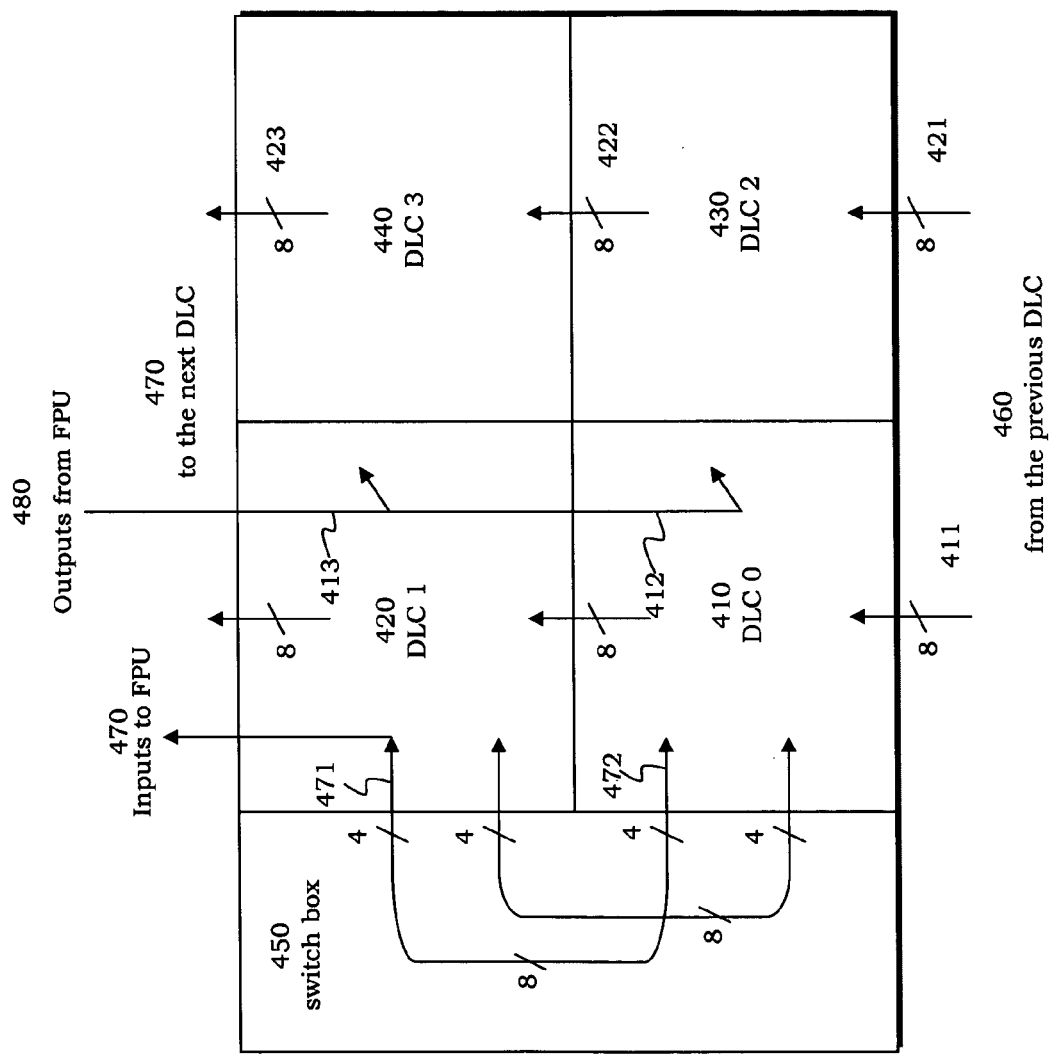
FIG. 4 is a block diagram illustrating a logic and routing block comprising a first dedicated logic cell, a second dedicated logic cell, a third dedicated logic cell, a fourth dedicated logic cell and a switch box for providing programmable switch matrices in accordance with the present invention.

In FIG. 4, there is shown a block diagram illustrating a logic and routing block 400 comprising a first dedicated logic cell (DLC 0) 410, a second dedicated logic cell (DLC 1) 420, a third dedicated logic cell (DLC 2) 430, a fourth dedicated logic cell (DLC 3) 440 and a switch box 450 for providing programmable switch matrices. A set of dedicated lines is used to interconnect between adjacent dedicated logic cells, either for connects to adjacent dedicated logic cells within the logic and routing block, adjacent dedicated logic cells between the logic and routing block 400 and a previous logic and routing block, or connecting to adjacent dedicated logic cells between the logic routing block 400 and a next logic and routing block. A first set of eight dedicated lines 411 is connected from a previous dedicated logic cell 460 (not shown) to the first dedicated logic cell 410. A second set of eight dedicated lines 412 is connected from the first dedicated logic cell DLC0 410 to the second dedicated cell DLC1 420. A third set of dedicated lines 413 is connected from the second dedicated cell 420 to the next dedicated local cell 470 (not shown). A fourth set of eight dedicated lines 421 is connected from the previous dedicated logic cell 460 (not shown) to the third dedicated logic cell 430. A fifth set of eight dedicated lines 422 is connected from the third dedicated logic cell 430 to the fourth dedicated logic cell 440. A sixth set of eight dedicated lines 423 is connected from the fourth dedicated logic cell 440 to inputs 470 of the FPU 100. The switchbox 450 functions as a source for feeding control of data signals to any one of the dedicated lines 411, 412, 413, 421, 422, or 423. While the first set of eight dedicated lines 411 and the fourth set of eight dedicated lines 421 are connected from the previous logic and cell block 460, (not shown) the third set of eight dedicated lines 413 and the sixth set of eight dedicated lines 423 are connected to the inputs 470 of the FPU 100. The switchbox 450 has various 4-bit connections to the DLC0 410 and DLC1 420 for generating signals to FPU to serve as inputs. In this illustrative diagram, a 4-bit line 471 in the DLC1 420 and a 4-bit line 472 in the DLC0 410 are connected to inputs to the FPU 470. Outputs 480 from the FPU 100 are connected to lines 413 in the DLC1 420 and lines 412 in the DLC0 410.

The one or more dedicated lines can be driven by the previous corresponding one or more dedicated lines as well as driving the next corresponding one or more dedicated lines, which would extend the distance of the dedicated lines. In effect, one set of dedicated lines can be connected ("stitched") to another set of dedicated lines, as may be called for by a particular programmable logic device, for concatenating different sets of dedicated lines together that extend across different logic and routing blocks.

Figures 5A, 5B:
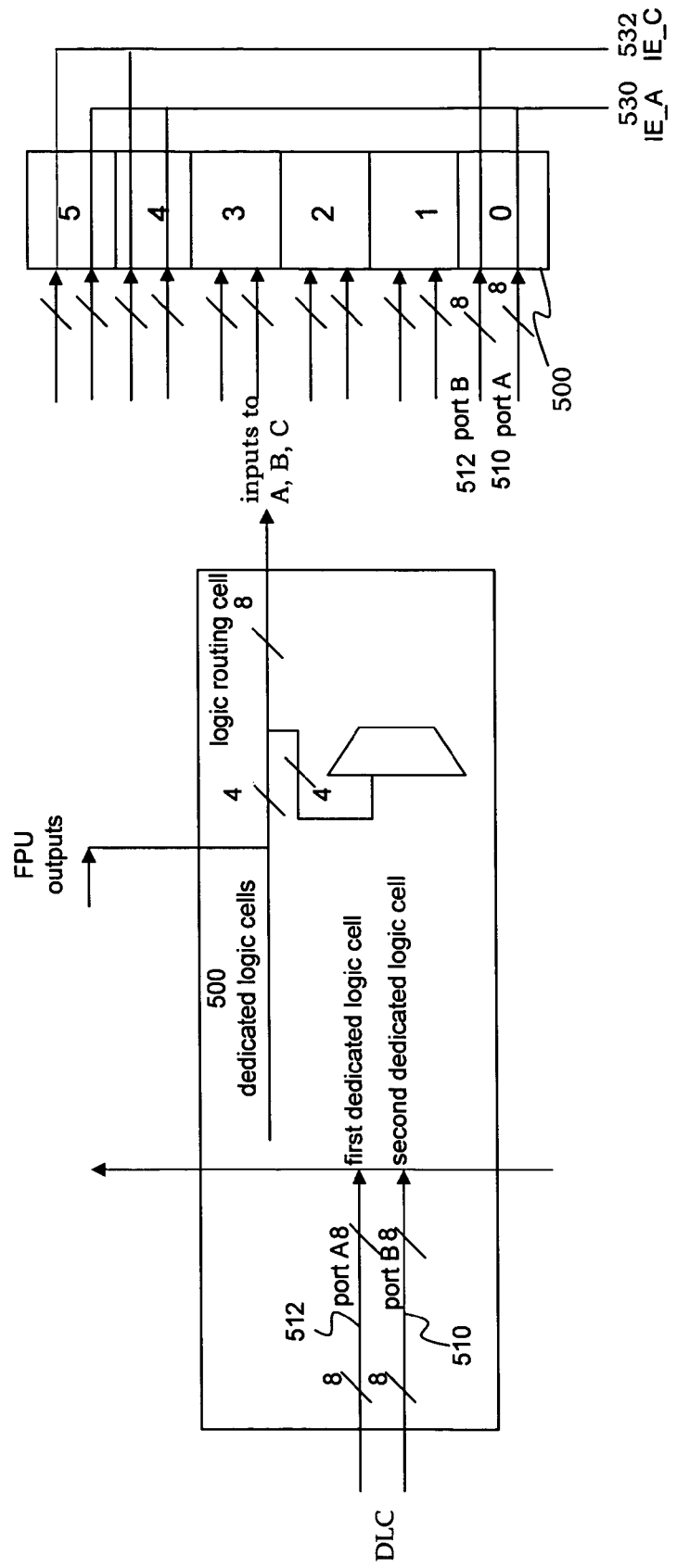
FIGS. 5A-5B are block diagrams illustrating an example of a connectivity between a dedicated logic cell and the floating point unit in accordance with the present invention.
Figure 5D:
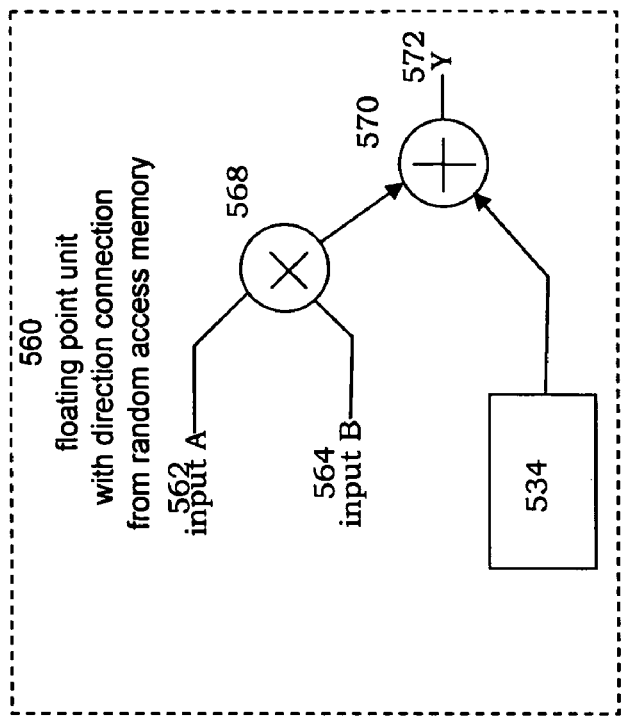
FIG. 5D is a block diagram illustrating a second embodiment of a direct connection from a memory to a floating point in accordance with the present invention.
Figure 5C:
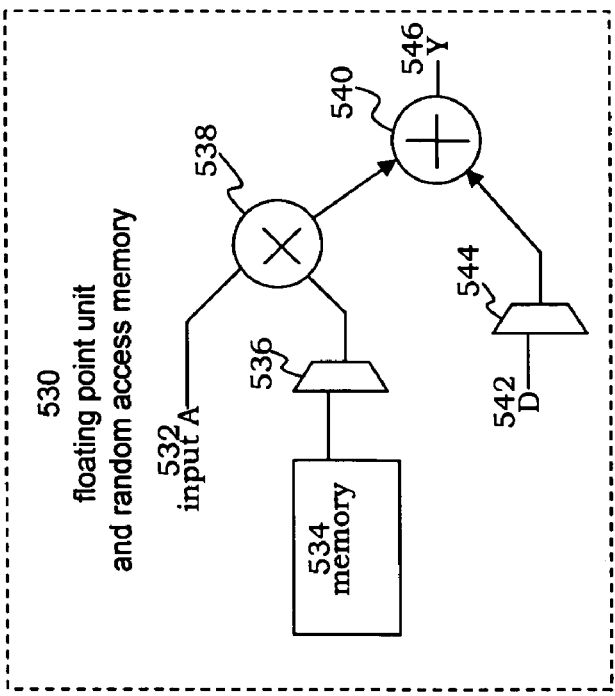
FIG. 5C is a block diagram illustrating a first embodiment of a direct connection from a memory to the floating point unit in accordance with the present invention.

FIGS. 5A-5B are block diagrams illustrating an example of a connectivity between a DLC 500 and the floating point unit 100. The dedicated logic cells 500, which includes two dedicated logic cells, receives input lines from port A 510 and port B 512 from external dedicated logic cells and generate outputs. A plurality of dedicated logic cells are shown in FIG. 5B where the two dedicated logic cells 500 in block 0 receive the port A 510 input and the port B 512 input. Additional blocks 1, 2, 3, 4 and 5 are shown attached to block 0. Various port A inputs are connected together to generate IE_A 530 outputs. Various port B inputs are connected together to generate IE_C 532 outputs. FIG. 5C is a block diagram illustrating a first embodiment 530 of a direct connection from a memory to the floating point unit. A multiplexer 536 has an input for receiving an input from a memory 534. A multiplexer 538 multiplies an input operand A 532 with the memory input from the multiplexer 536. An adder 540 sums the output from the multiplier 538 and an operand D 542 through a multiplexer 544 and generates an output Y 546, wherein the output Y 546=A*memory output+D. FIG. 5D is a block diagram illustrating a second embodiment 560 in a direct connection from a memory to a floating point. A multiplexer 568 has a first input for receiving a first operand A 562, and a second input for receiving a second operand B 564. An adder 570 sums a first input received from the output from the multiplier 568 and a second input for receiving an operand M 536. As an example, the floating point unit could receive the first operand A from a dedicated logic cell, and receives the third operand M directly from the memory. The adder 570 generates an output Y 572 of the floating point unit by summing an output from the multiplexer 568 and from the memory 534, where the output Y=A*B+M.

Figure 6:
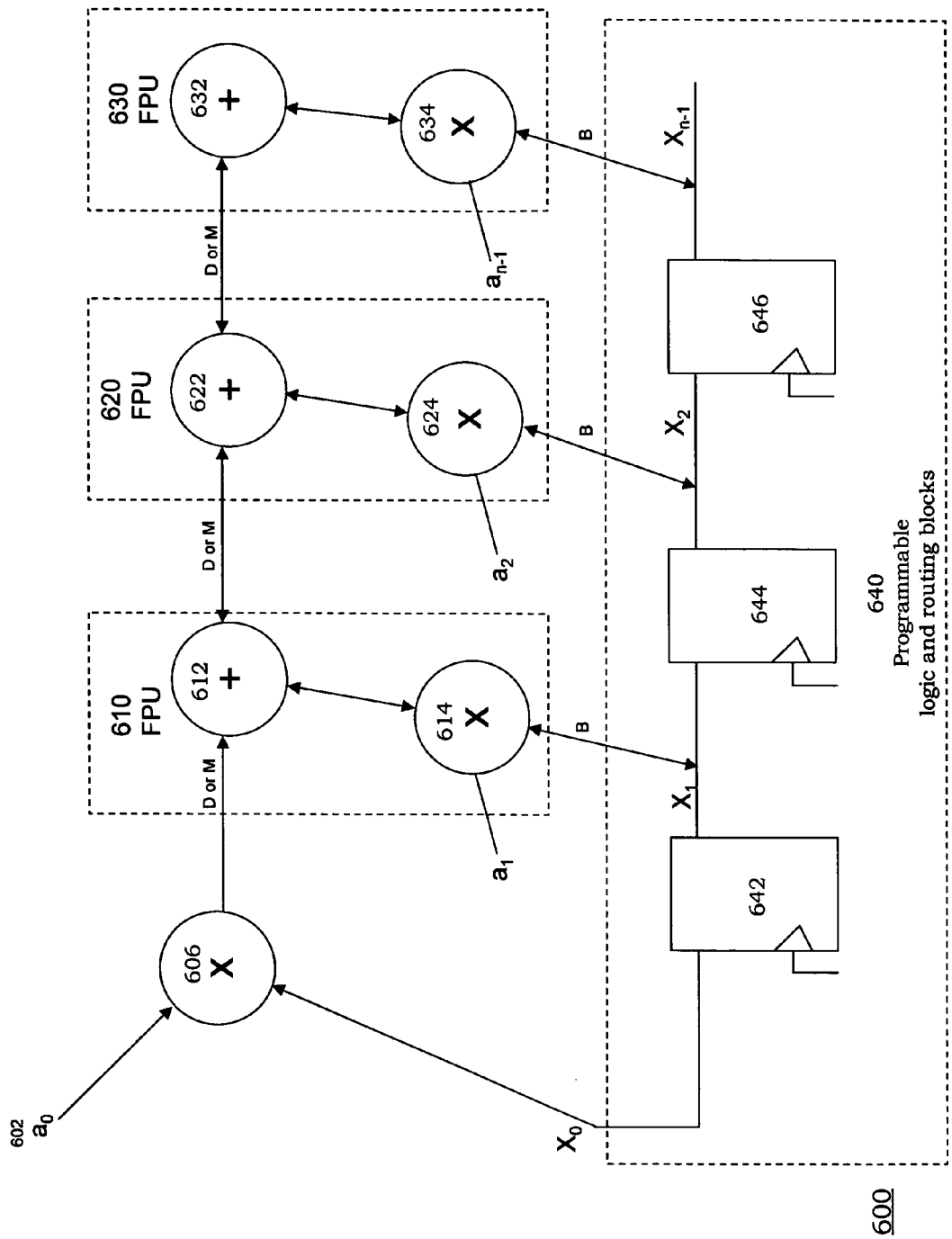
FIG. 6 is an architectural diagram illustrating a system having multiple floating point units operating in conjunction with programmable logic and routing blocks in accordance with the present invention.

In FIG. 6, there is shown an architectural diagram illustrating a system 600 having multiple floating point units operating in conjunction with programmable logic and routing blocks. The system 600 comprises a first configurable floating point unit 610, a second configurable floating point unit 620, and a third configurable floating point unit 630 and programmable logic and routing blocks 640. The first, second and third configurable floating point units 610, 620 630 are coupled to the programmable logic and routing blocks 640. The programmable routing blocks 640 comprise a register 642 in generating an $X_1$ output, a register 644 in generating an $X_2$ output, and a register 646 in generating an $X_{n-1}$ output. A multiplexer 606 receives a first input of $a_0$ and a second input $x_0$, and multiples the first input $a_0$ with the second input $x_0$. The first FPU unit 610 has a multiplier 614 that multiples $a_1$ and $x_1$, and an adder 612 to sum $a_0x_0+a_1x_1$. The second FPU unit 620 has a multiplier 624 that multiplexes $a_2x_2$ and an adder 622 that sums $a_0x_0+a_1x_1+a_2x_2$. The third FPU unit 630 has a multiplier 634 that multiplies $a_{n-1}x_{n-1}$, and an adder 632 that sums $a_0x_0+a_1x_1+a_2x_2+a_{n-1}x_{n-1}$. The resulting mathematical representation is a sum of product $a_0 x_0+a_1 x_1++ \ldots +a_{n-1}x_{n-1}$.

Figure 7:
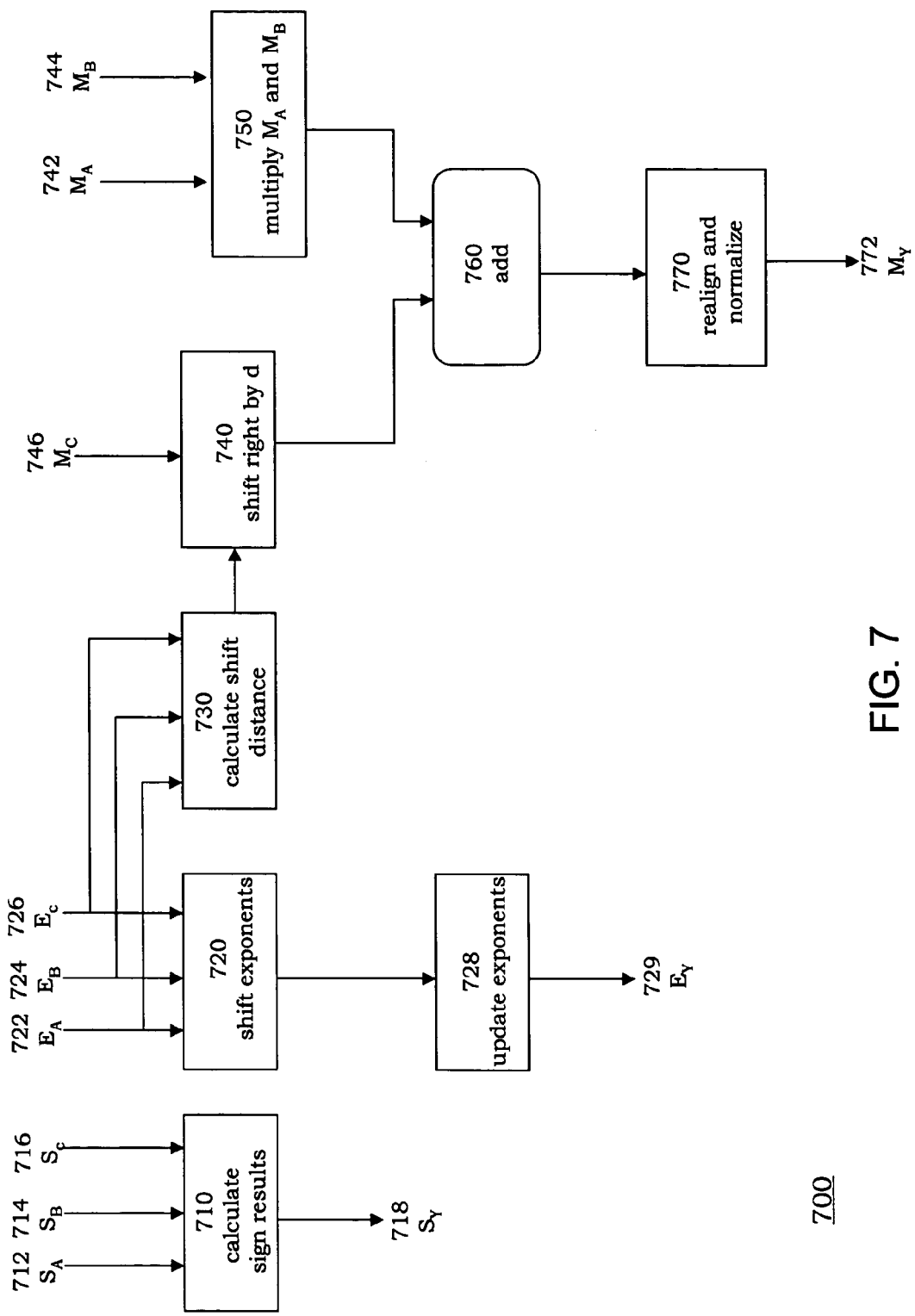
FIG. 7 is a flow diagram illustrating the process in operating a floating point unit in accordance with the present invention.

Turning now to FIG. 7, there is shown a flow diagram illustrating the process 700 in operating a floating point unit. At step 710, the process 700 receives inputs $S_A$ 712, $S_B$ 714 and $S_C$ 716 and calculates the sign results of $S_A$ 712, $S_B$ 714 and $S_C$ 716 to generate an output $S_Y$ 18. At step 720, the process 700 receives inputs $E_A$, $E_B$ and $E_C$ and shifts the exponent values of $E_A$, $E_B$ and $E_C$. At step 728, the process 700 updates the exponents to generate an output $E_Y$ 729. At step 730, the process 700 calculates the shift distance of the inputs $E_A$, $E_B$ and $E_C$. The process 700 at step 740 shifts right by a distance of the result from step 730 and an input $M_C$ 746. At step 750, the process 750 multiplies a first input $M_A$ 742 by a second input $M_B$ 744. An adder 760 sums the results from step 740 and step 750. At step 770, the process 770 realigns and normalizes the summation from step 760 to generate an output $M_Y$ 772.

Figure 8:
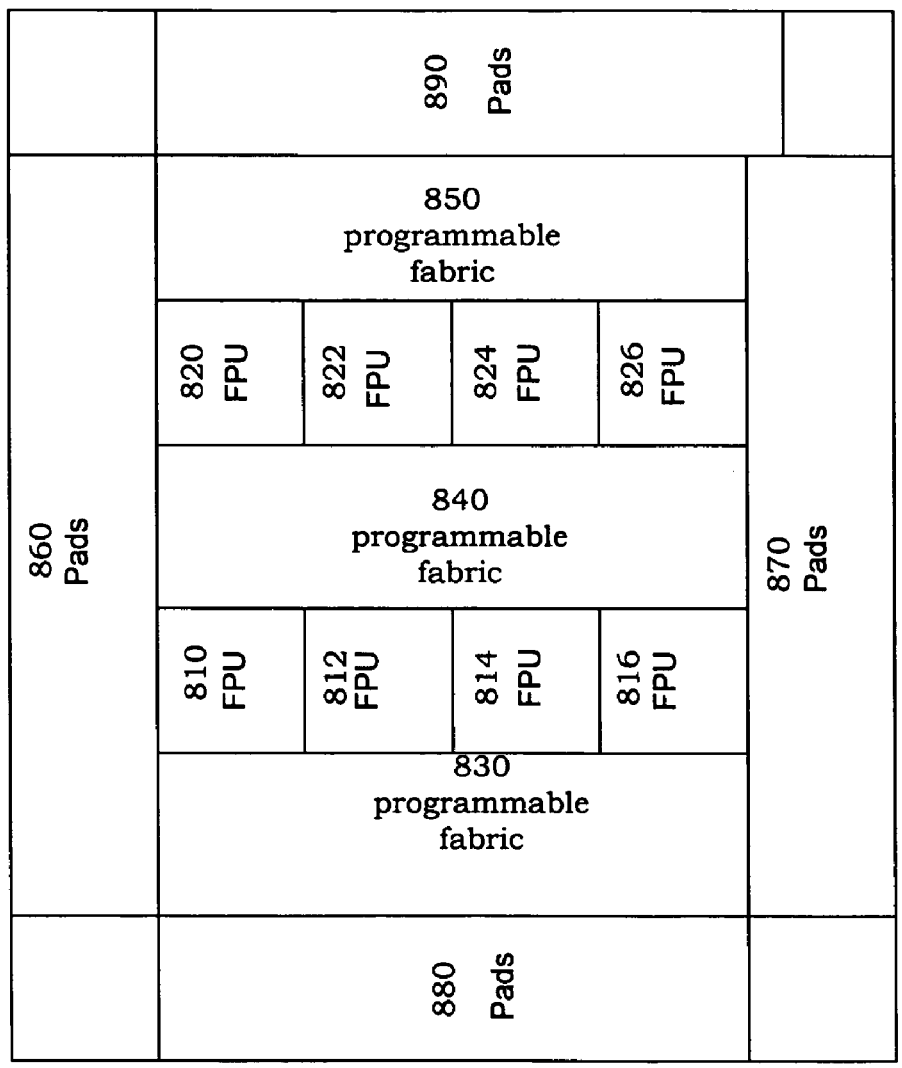
FIG. 8 is a flow diagram illustrating an architectural diagram illustrating a system with multiple floating point units and multiple programmable fabrics in accordance with the present invention.

As shown in FIG. 8, there is an architectural diagram illustrating a system 800 with multiple floating point units and multiple programmable logic and routing fabrics. The system 800 has a first set of floating point units 810, 812, 814, and 816 placed between a programmable fabric 830 and programmable fabric 840. The system 800 further has a second set of floating point unit 820, 822, 824 and 826 placed between the programmable logic and routing fabric 840 and a programmable fabric 850. The system 800 has pads 860, 870, 880 and 890 surrounding the outer peripheral of the floating point units 810, 812, 814, 816, 820, 822, 824 and 826 and programmable fabrics 830, 840 and 850. One of ordinary skill in the art should recognize that other types of interface means other than pads, such as a ball grid array, can be practiced without departing from the spirits of the present invention.

Figure 9:
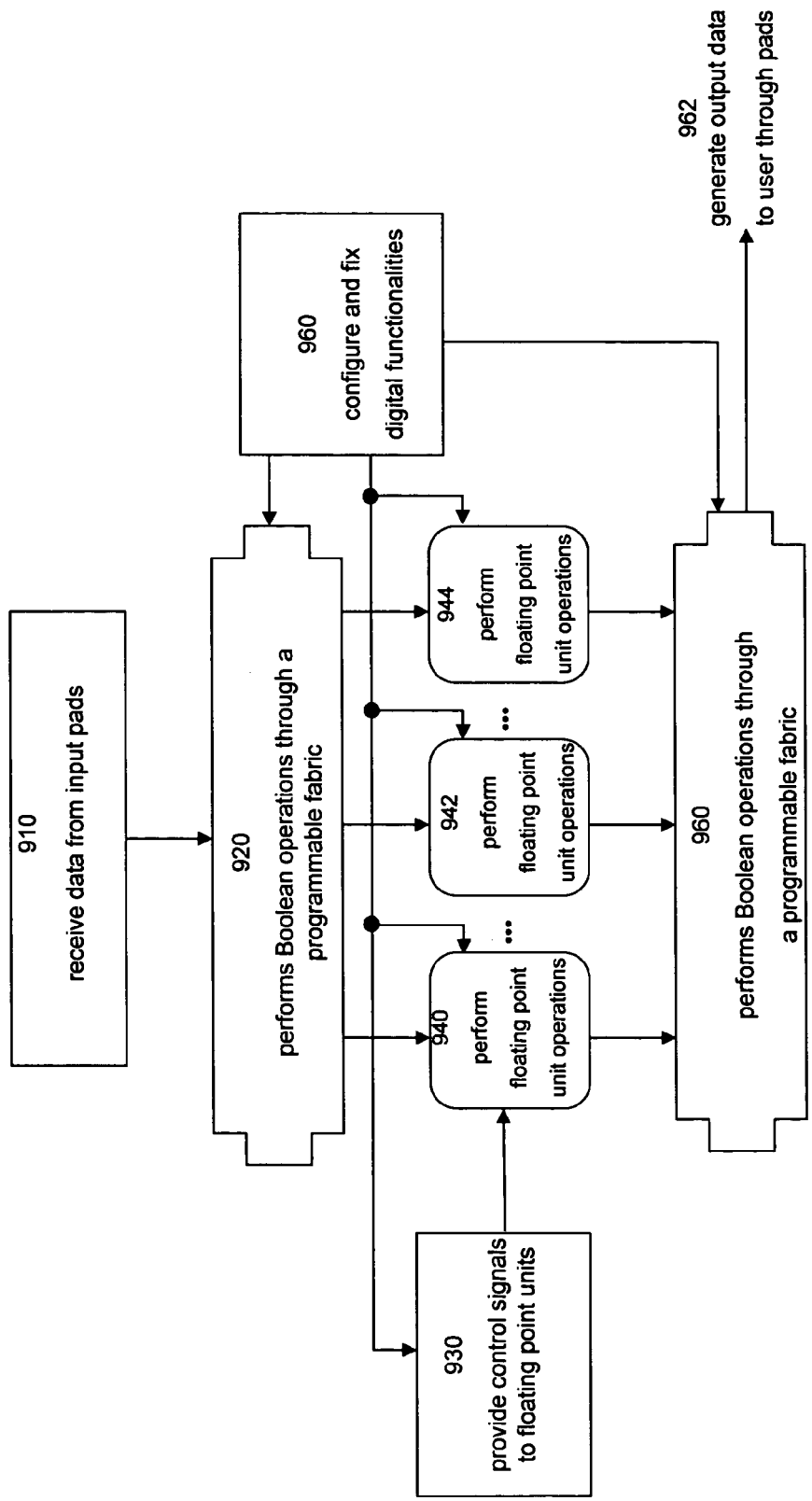
FIG. 9 is a flow diagram illustrating the operational process of a system with multiple floating point units and multiple programmable fabrics in accordance with the present invention.

In FIG. 9, there is shown a flow diagram illustrating the operational process 900 of a system with multiple floating point units and multiple programmable logic and routing fabrics. At step 910, the process 900 received data from input pads. At step 920, the process 900 performs Boolean operations through a programmable fabric. At step 930, the process provides control signals to floating point units. At steps 942, 944 and 946, the process 900 performs floating point unit operations by a first floating point unit, a second floating point unit, and a third floating point unit, respectively. At step 950, the process 900 configures and fixes digital functionalities of a programmable fabric to perform a particular operation. At step 960, the process 900 receives the result from step 950 and performs Boolean operations through a programmable fabric, and generates an output data to users through pads.

Figure 10:
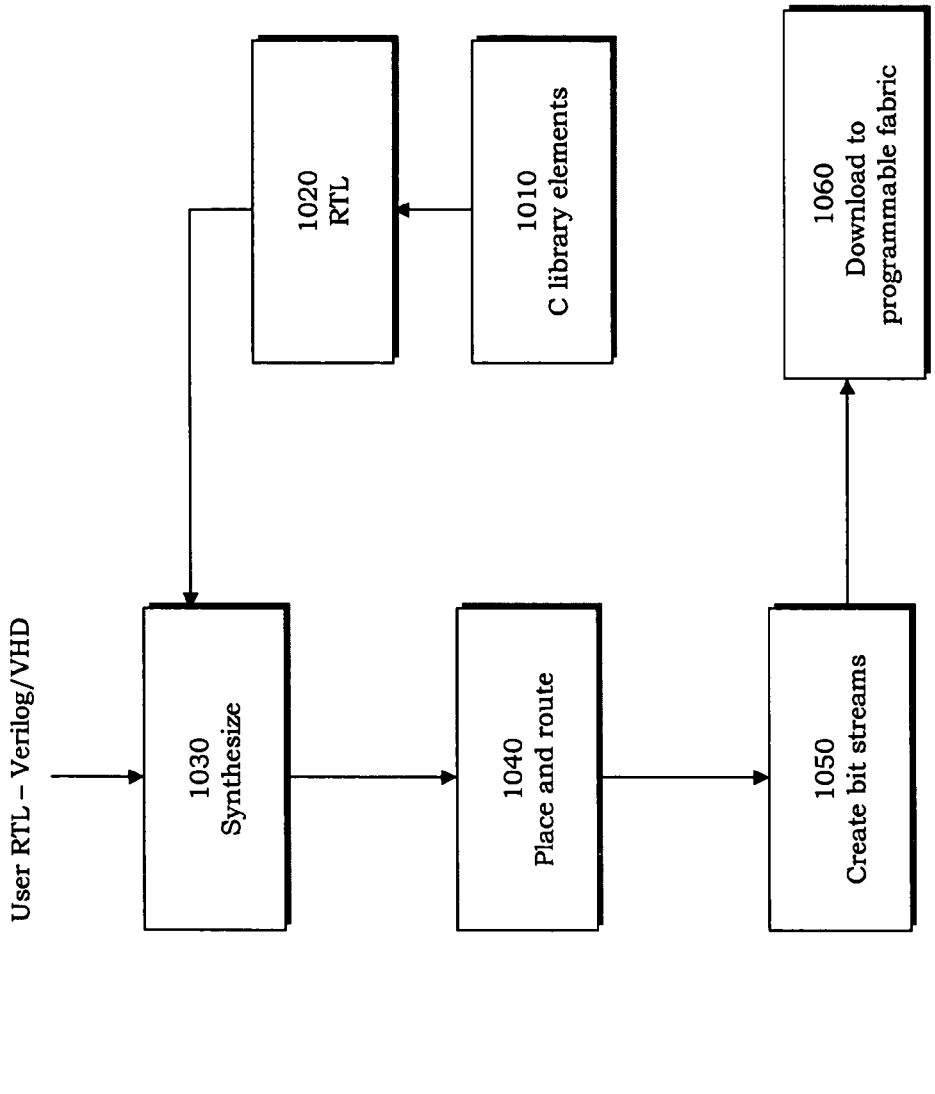
FIG. 10 is a flow diagram illustrating a first application process in utilizing a programmable system with configurable floating point units and programmable logic and routing fabrics to implement a high performance computing in accordance with the present invention.

Referring now to FIG. 10, there is shown a flow diagram illustrating a first application process 1000 of utilizing a system with floating point units and programmable fabrics to implement a high performance computing ("HPC"). At step 1010, the process 1000 accesses the C library elements. At step 1020, the process 1000 converts the C library elements to a register transfer level (RTL) code. The process 1000 synthesizes at step 1030 from a first input of the RTL code from step 1020 and from a second input receiving a user RTL code. At step 1040, the process 1000 places and routes a design. At step 1050, the process creates bit streams from the design. At step 1060, the process downloads the bit streams to a programmable integrated circuit or a programmable system such as the one shown in the system 200 in FIG. 2, or a system 1300 shown in FIG. 13.

Figure 11:
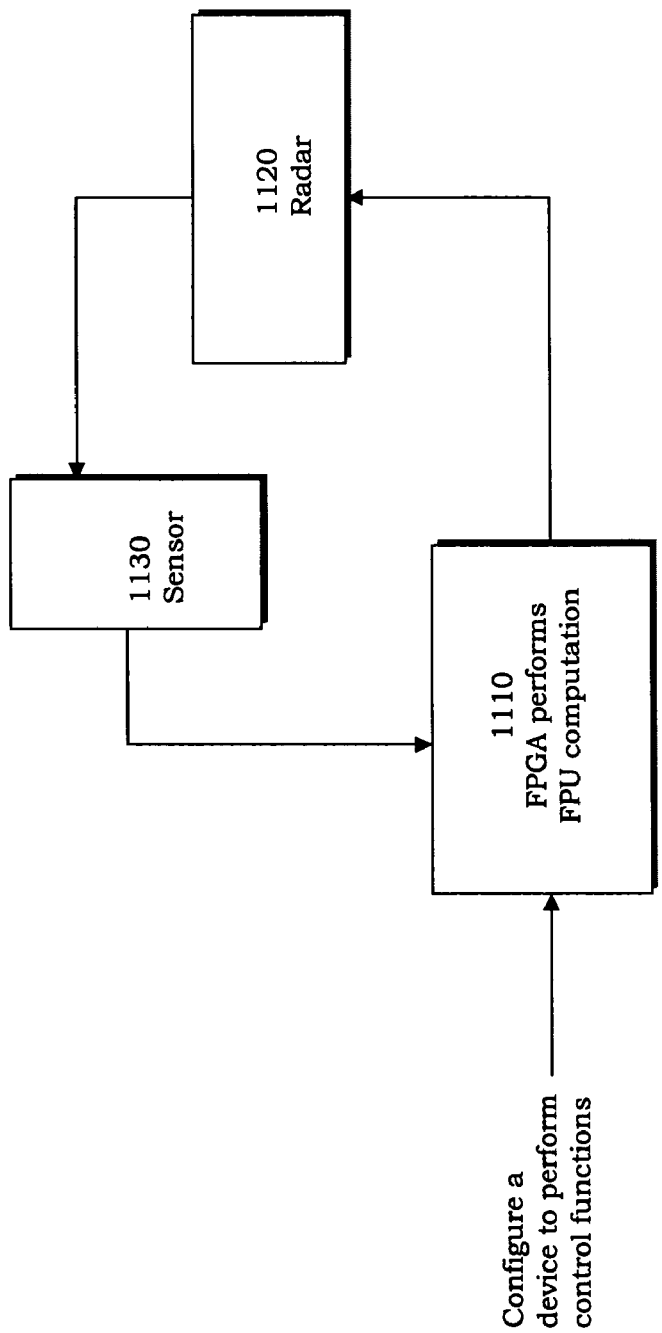
FIG. 11 is a block diagram illustrating a second application in implementing a configurable floating point unit with programmable logic and routing fabric as a real-time DSP controller in accordance with the present invention.

In FIG. 11, there is shown a block diagram illustrating a second application in implementing a configurable floating point unit with programmable fabric as real-time DSP controller 1100. At step 1110, the programmable system 1300 performs one or more floating point computations, such as Fast Fourier Transforms, a Finite Impulse Response (FIR) filter or an Infinite Impulse Response (IIR) filter. The programmable system 1300 is configured to perform one of the real-time DSP controller functions. The programmable system 1300 provides a feedback at step 1120 to a radar. The radar provides real-time information to the sensor at step 1130, in which the sensing information is routed to the programmable system 1300.

Figure 12:
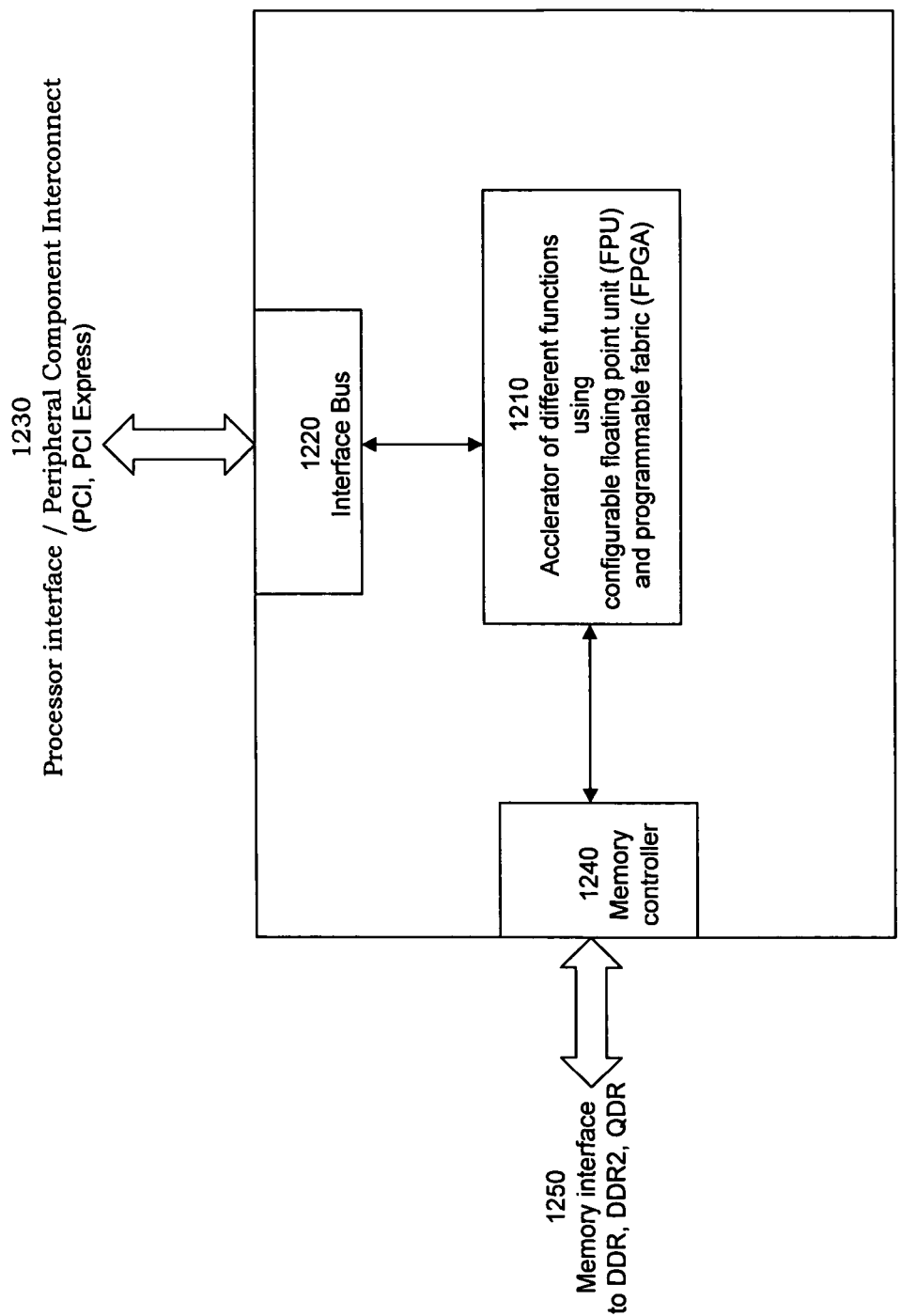
FIG. 12 is a block diagram illustrating a third application in implementing a configurable floating point unit with programmable logic and routing fabric as an application accelerator system in accordance with the present invention.

FIG. 12 is a block diagram illustrating a third application in implementing a configurable floating point unit with programmable fabric as an application accelerator system 1200. The application accelerator system 1200 comprises an accelerator 1210 of different functions using a configurable floating point unit and a programmable fabric. The accelerator 1210 is coupled to an interface bus 1220 for communicating a processor interface/Peripheral Component Interconnect (PCI or PCI Express) 1230. The accelerator 1210 is further coupled to a memory controller 1240 for communicating a memory interface 1250 to a memory such as a DDR memory, a DDR2 memory, or a QDR memory. Some suitable applications of the accelerator system 1200 include a matrix multiplier and a sparse matrix-vector multiplication (SMVM). One of ordinary skill in the art should recognize that other types of accelerator applications are applicable when departing from the spirits of the present invention.

The term "programmable logic and routing blocks" are used interchangeably with the term "a programmable logic and routing fabric" or "a programmable fabric".

The invention has been described with reference to specific exemplary embodiments. Various modifications, adaptations, and changes may be made without departing from the spirit and scope of the invention. Accordingly, the specification and drawings are to be regarded as illustrative of the principles of this invention rather than restrictive, the invention is defined by the following appended claims.

We claim:

1. A programmable integrated circuit comprising:
   a configurable floating point unit for performing floating point calculations;
   a logic and routing block having a plurality of dedicated logic cells, each dedicated logic cell having a first logic and routing cell and a second logic and routing cell;
   one or more first dedicated lines connecting from the first logic and routing cell in the first dedicated logic cell of the logic and routing block to a first plurality of inputs in the configurable floating point unit; and
   one or more second dedicated lines connecting from a first plurality of outputs in the configurable floating point unit to the first logic and routing cell in a first dedicated logic cell of the logic and routing block.

2. The programmable system of claim 1, further comprising a memory; and
   one or more third dedicated lines connecting from the memory to a second plurality of inputs in the configurable floating point unit.

3. The programmable system of claim 2, further comprising one or more fourth dedicated lines connecting from a second plurality outputs in the configurable floating point unit to the memory.

4. The programmable integrated circuit of claim 1, wherein the floating point unit comprises:
   a pre-normalization block for receiving a first input including a sign bit, an exponent field and a mantissa field from a dedicated logic cell, the pre-normalization block shifting the exponent field and shifting the mantissa in generating an output $F_A$; and
   a post-normalization block coupled to the pre-normalization block for receiving the output Z from the pre-normalization block, the post-normalization block normalizing and rounding the received input Z.

5. The programmable integrated circuit of claim 4, wherein the pre-normalization block receives a second input comprising a sign bit, an exponent field and a mantissa field from the dedicated logic cell, the pre-normalization block shifting the exponent field and shifting the mantissa in generating an output $F_B$.

6. The programmable integrated circuit of claim 5, further comprising a set of multiplexers coupled to the post-normalization block for selecting a load signal, a clear signal, and an enable signal.

7. A programmable system for direct memory connections, comprising:
   a floating point unit for performing floating point calculations;
   a logic and routing block having a plurality of dedicated logic cells, each dedicated logic cell having a first logic and routing cell and a second logic and routing cell; and a first memory coupled to the floating point unit, the first memory having one or more first dedicated lines connecting to at least one input of the floating point unit, one or more second dedicated lines connecting to at least one output of the floating point unit, one or more third dedicated lines connecting from at least one input of the first memory to the first logic and routing cell, and one or more fourth dedicated lines connecting from the first logic and routing cell to at least one output of the first memory.

8. The programmable system of claim 7 further comprising a second memory that has one or more dedicated connections to the floating point unit.

9. The programmable system of claim 8 further comprising a second column of dedicated logic cells coupled to the floating point unit.

* * * * *

UNITED STATES PATENT AND TRADEMARK OFFICE
CERTIFICATE OF CORRECTION

PATENT NO. : 7,814,136 B1 Page 1 of 1
APPLICATION NO. : 11/344694
DATED : October 12, 2010
INVENTOR(S) : Hare K. Verma, Ravi Sunkavalli and Manoj Gunwawni It is certified that error appears in the above-identified patent and that said Letters Patent is hereby corrected as shown below:

In Figure 4, delete "470 to the next DLC" and insert therein --475 to the next DLC--.

In Column 1, line 42, delete "well-know" and insert therein --well-known--.

In Column 7, line 38, delete "470" and insert therein --475--.

In Column 9, lines 15 and 16, delete "942, 944 and 946" and insert therein --940, 942 and 944--.

Signed and Sealed this

Fourteenth Day of December, 2010

David J. Kappos
*Director of the United States Patent and Trademark Office*